(12) United States Patent
Sim et al.

(10) Patent No.: US 7,541,662 B2
(45) Date of Patent: Jun. 2, 2009

(54) PACKAGING CHIP HAVING INDUCTOR THEREIN

(75) Inventors: Dong-ha Sim, Seoul (KR); In-sang Song, Seoul (KR); Duck-hwan Kim, Goyang-si (KR); Yun-kwon Park, Dongducheon-si (KR); Seok-chul Yun, Suwon-si (KR); Kuang-woo Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 54 days.

(21) Appl. No.: 11/435,985

(22) Filed: May 18, 2006

(65) Prior Publication Data

US 2007/0018281 A1 Jan. 25, 2007

(30) Foreign Application Priority Data

Jul. 19, 2005 (KR) ...................... 10-2005-0065508

(51) Int. Cl.
*H01L 29/00* (2006.01)
*H01L 23/12* (2006.01)

(52) U.S. Cl. ........................ 257/531; 257/724; 257/698; 257/704; 257/E23.193

(58) Field of Classification Search ................. 257/531, 257/724, 698, 728, 704, E23.193
See application file for complete search history.

(56) References Cited

U.S. PATENT DOCUMENTS

| | | | |
|---|---|---|---|
| 3,349,481 A * | 10/1967 | Karp | ........................... 29/846 |
| 3,601,522 A | 8/1971 | Lynch | |
| 3,760,090 A | 9/1973 | Fowler | |
| 4,977,441 A | 12/1990 | Ohtani et al. | |
| 5,679,975 A | 10/1997 | Wyland et al. | |
| 5,845,860 A | 12/1998 | Tohjo et al. | |
| 5,864,092 A * | 1/1999 | Gore et al. | ..................... 174/51 |
| 6,232,660 B1 * | 5/2001 | Kakimoto et al. | ........... 257/728 |
| 6,362,525 B1 * | 3/2002 | Rahim | ........................ 257/738 |
| 6,515,870 B1 * | 2/2003 | Skinner et al. | .............. 361/800 |
| 6,568,617 B1 | 5/2003 | Rambosek | |
| 6,911,733 B2 * | 6/2005 | Kikuchi et al. | .............. 257/728 |
| 2002/0109027 A1 | 8/2002 | Ishihara et al. | |
| 2003/0062437 A1 | 4/2003 | Tatsumi et al. | |
| 2003/0062541 A1 * | 4/2003 | Warner | ....................... 257/200 |
| 2003/0089970 A1 * | 5/2003 | Gates et al. | ................. 257/678 |
| 2003/0189119 A1 | 10/2003 | Morita et al. | |

FOREIGN PATENT DOCUMENTS

| | | |
|---|---|---|
| EP | 1204114 A1 | 5/2002 |
| JP | 57-64953 A | 4/1982 |
| JP | 9-204755 A | 8/1997 |

\* cited by examiner

*Primary Examiner*—Nitin Parekh
(74) *Attorney, Agent, or Firm*—Sughrue Mion, PLLC

(57) ABSTRACT

A packaging chip having inductors therein is provided. The packaging chip includes a substrate for mounting a circuit element therein, at least one port formed on a surface of the substrate, a sealing portion electrically connected on the substrate to the circuit element and the at least one port, respectively, and a packaging substrate bonded to the substrate through the sealing portion and packaging the circuit element. In this case, the sealing portion has a certain magnitude of inductance since it is formed of a conductive material, thereby serving as an inductor. Accordingly, the packaging chip having an inductor therein can be implemented in a small size.

3 Claims, 3 Drawing Sheets

PACKAGING CHIP HAVING INDUCTOR THEREIN

CROSS-REFERENCE TO RELATED APPLICATIONS

This application claims priority under 35 U.S.C. § 119(a) of Korean Patent Application No. 2005-65508, filed Jul. 19, 2005 in the Korean Intellectual Property Office, the entire contents of which are incorporated herein by reference.

BACKGROUND OF THE INVENTION

1. Field of the Invention

The present invention relates to a packaging chip having an inductor therein and, more particularly, to a packaging chip using as an inductor a sealing material needed for packaging.

2. Description of the Related Art

Electronic chips diversely used in various electronic products can be easily damaged by external shock since the chips have minute electronic circuits therein. Therefore, in the process of manufacturing a chip, a packaging process is inevitably required.

The packaging process refers to a job wherein a circuit element is provided with physical functions and a shape so as to be mounted on an electronic component. That is, the packing process refers to a job of hermetically sealing the circuit element in order to prevent the introduction of foreign material into the circuit element or damaging the circuit element due to external shock. In order to hermetically seal the circuit element, a separate substrate is used and fabricated into a packaging substrate, which is bonded to a base substrate mounting the circuit element therein. As above, the chip over which the packaging has been done is generally referred to as a packaging chip. Specifically, wafer level packaging is performed so that compactness, high performance, and so on, can be achieved, coping with the recent trend of electronic products.

Meanwhile, the circuit element mounted in the chip can be a thin film bulk acoustic resonator or the like. In this case, the acoustic resonators having uniform frequency characteristics are properly arranged on the base substrate and connected to the elements, such as inductors or the like, to implement filters.

FIGS. 1A and 1B are views for showing a shape of an inductor 20 formed on a base substrate 10 in a conventional manner. FIG. 1A shows an inductor 20 formed in a spiral shape, and FIG. 1B shows an inductor 20 formed in a meandering shape. The inductors 20 formed as in FIGS. 1A and 1B take up a relatively wide area on the base substrate 10. Accordingly, if the inductors 20 are included in the chip, the size of the chip itself becomes large. Therefore, the chip is hardly ever used in a small-sized communication device such as a cellular phone.

In addition, the widths of the inductors 20 have to be narrow in order for the inductors 20 to be formed in the shapes shown in FIGS. 1A and 1B. Accordingly, the vertical cross-sectional areas of the inductors 20 are reduced, which results in a large resistance value. Consequently, there exists a problem in that the Q (Quality factor) value of the chip itself becomes low.

SUMMARY OF THE INVENTION

The present invention has been developed in order to solve the above drawbacks and other problems associated with the conventional arrangement.

An aspect of the present invention is to provide a packaging chip, capable of reducing a chip size and enhancing a Q value by forming inductors having a wide width and disposed on the edges of a substrate in the form of a sealing material used for packaging.

The foregoing and other objects and advantages are substantially realized by providing a packaging chip, comprising a substrate for mounting a circuit element therein; at least one port formed on a surface of the substrate; a sealing portion electrically connected on the substrate to the circuit element and the at least one port, respectively; and a packaging substrate bonded to the substrate through the sealing portion and packaging the circuit element.

In this case, the sealing portion is formed of a conductive material, and thus can have a certain magnitude of inductance.

The at least one port may include a signal port and a ground port.

The sealing portion may include a sealing line stacked on an edge of the substrate; a first connection line for electrically connecting at least one of the signal port and the ground port to the sealing line; and a second connection line for electrically connecting the circuit element to the sealing line.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE ILLUSTRATIVE, NON-LIMITING EMBODIMENTS OF THE INVENTION

Hereafter, illustrative, non-limiting embodiments of the present invention will be described in detail with reference to the accompanying drawings.

Figure 2:
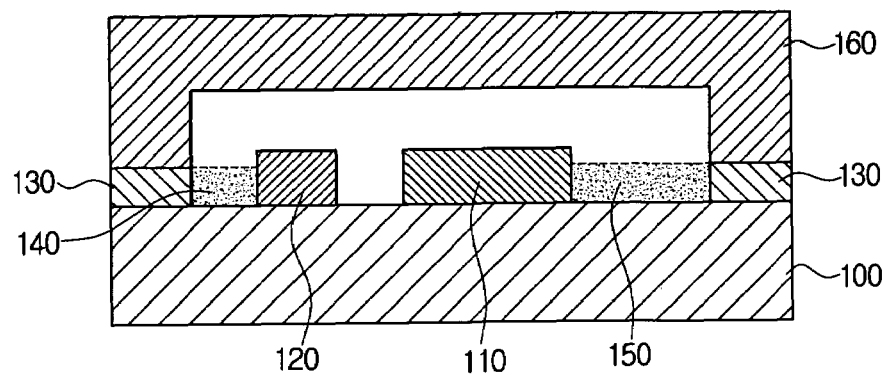
FIG. 2 is a vertical cross-sectional view for showing a structure of a packaging chip according to an exemplary embodiment of the present invention.

FIG. 2 is a vertical cross-sectional view for showing a structure of a packaging chip according to an exemplary embodiment of the present invention. In FIG. 2, the packaging chip has a substrate 100, a circuit element 110, a port 120, a sealing line 130, a first connection portion 140, a second connection portion 150, and a packaging substrate 160.

The substrate 100 can be a general silicon wafer.

The circuit element 110 can be at least one of various elements such as a resistor, inductor, capacitor, amplifier, bulk acoustic resonator, filter, duplexer, and the like. The circuit element 110 can be mounted on the upper surface of the substrate 100 or built in the substrate 100.

The port 120 is a portion electrically connected to external terminals. Although not shown in FIG. 2, a via electrode (not shown) penetrating the packaging substrate 160 can be formed, and electrically connected to the port 120 through a ball bump (not shown).

The sealing line 130, the first connection portion 140, and the second connection portion 150 form a sealing portion.

The sealing portion is formed in a manner of patterning the sealing material stacked on the substrate 100.

The sealing line 130 of the sealing portion is a portion stacked on the edge of the substrate 100, which serves to directly bond the substrate 100 to the packaging substrate 160.

The first connection portion 140 of the sealing portion electrically connects the port 120 to the sealing line 130.

The second connection portion 150 of the sealing portion serves to electrically connect one end of the circuit element 110 to the sealing line 130.

The sealing line 130, the first connection portion 140, and the second connection portion 150, which form the sealing portion, can be formed of the same conductive material. If the sealing line is formed of a conductive material, the sealing line 130 has inductance. Accordingly, the sealing line 130 operates as an inductor connecting the circuit element 110 and the port 120.

Figure 1A:
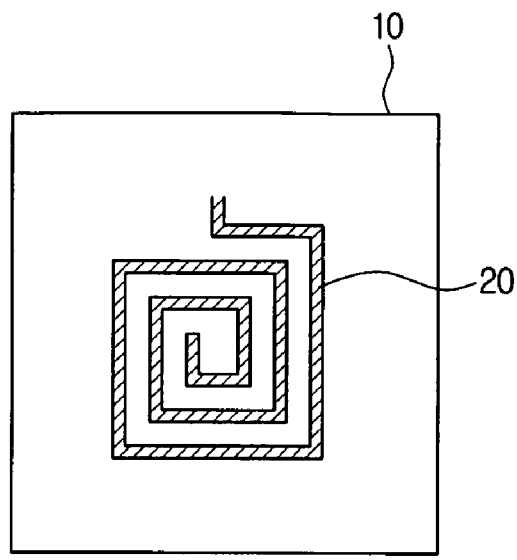
FIGS. 1A and 1B are views for showing a structure of an inductor used in a conventional circuit element.
Figure 1B:
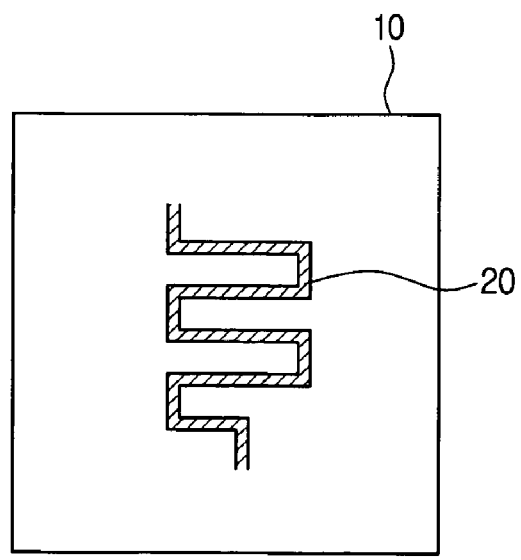

Consequently, without a separately formed inductor, a structure connecting the circuit element 110 and the inductor can be constructed. On the other hand, for tight packaging, the width of the sealing line 130 is generally wider than the widths of the inductors in FIGS. 1A and 1B. If the width becomes wide, the cross-sectional area of the sealing line 130 becomes large, and thus the resistance of the sealing line 130 becomes small. Accordingly, a Q value is improved, compared with when an inductor is separately formed.

Meanwhile, the packaging substrate 160 also can be a general silicon wafer. In this case, a predetermined portion of the lower surface of the packaging substrate 160 is etched, and the etched portion of the packaging substrate is preferably, but not necessarily, bonded to face the upper surface of the substrate 100 so as to secure space in which the circuit element 110 is located.

Figure 3:
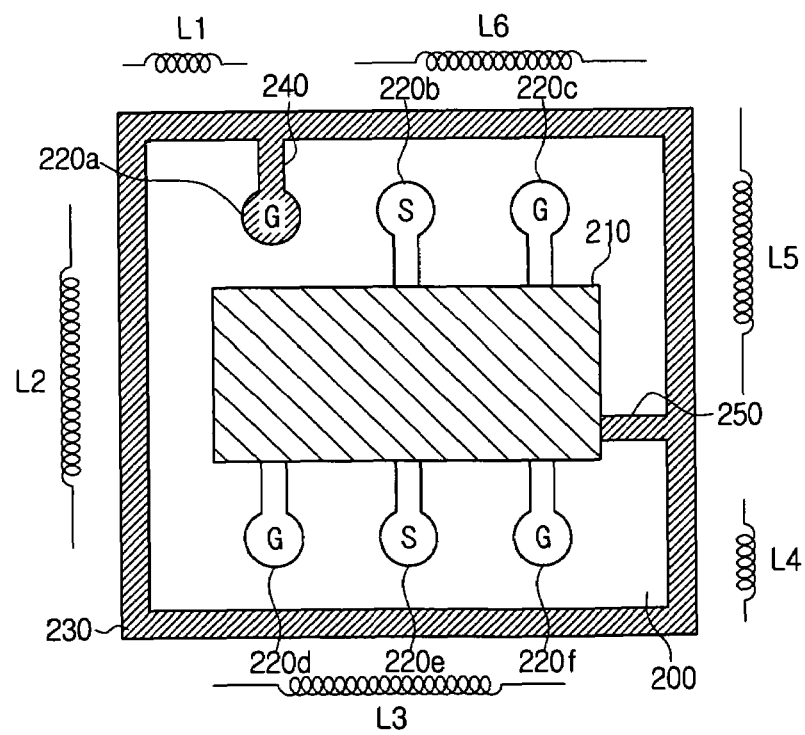
FIG. 3 is a horizontal cross-sectional view for showing a structure of a packaging chip according to another exemplary embodiment of the present invention.

FIG. 3 is a horizontal cross-sectional view for showing a structure of a packaging chip according to another exemplary embodiment of the present invention. In FIG. 3, the packaging chip has a substrate 200, a circuit element 210, first to sixth ports 220a to 220f, a sealing line 230, a first connection portion 240, and a second connection portion 250. In FIG. 3, the packaging substrate located on the uppermost portion of the packaging chip is omitted due to the characteristics of a horizontal cross-sectional view.

The packaging chip of FIG. 3 is provided with plural ports 220a to 220f. Six ports are shown in FIG. 3, but the number of ports can be arbitrarily determined according to the desired use or purpose of the packaging chip. Of the plural ports 220a to 220f, the second port 220b and the fifth port 220e are formed as signal ports, and the first, third, fourth, and sixth ports 220a, 220c, 220d, and 220f are formed as ground ports.

The first connection port 240 can connect the sealing line 230 to any of the ground and signal ports. In addition, FIG. 3 shows that only the first port 220a is connected to the sealing line 230, but plural ports can be connected to the sealing line according to the desired use or purpose of the packaging chip.

Meanwhile, the sealing line 230 is divided into left and right lines with reference to the locations where the first and second connection portions 240 and 250 are formed. Depending on the total length of the individual lines, the left and right lines have a different inductance magnitude from each other. That is, with reference to the first connection portion 240, the sealing line 230 up to the upper left corner has inductance of L1, the sealing line 230 on the left side has L2, the sealing line 230 on the lower side has L3, and the sealing line 230 from the lower right corner to the second connection portion 250 has L4. As a result, the left sealing line 230 operates as an inductor having inductance of L1+L2+L3+L4.

Likewise, the sealing line 230 from the second connection portion 250 to the upper right corner has inductance of L5, and the sealing line 230 from upper right corner to the first connection portion 240 has L6. Consequently, the right sealing line 230 operates as an inductor having inductance of L5+L6.

As shown in FIG. 3, since the inductance magnitude changes depending on the location where the first connection portion 240 or the second connection portion 250 is formed, the inductance magnitude can be tuned as the location of the connection portion is adjusted.

Figure 4:
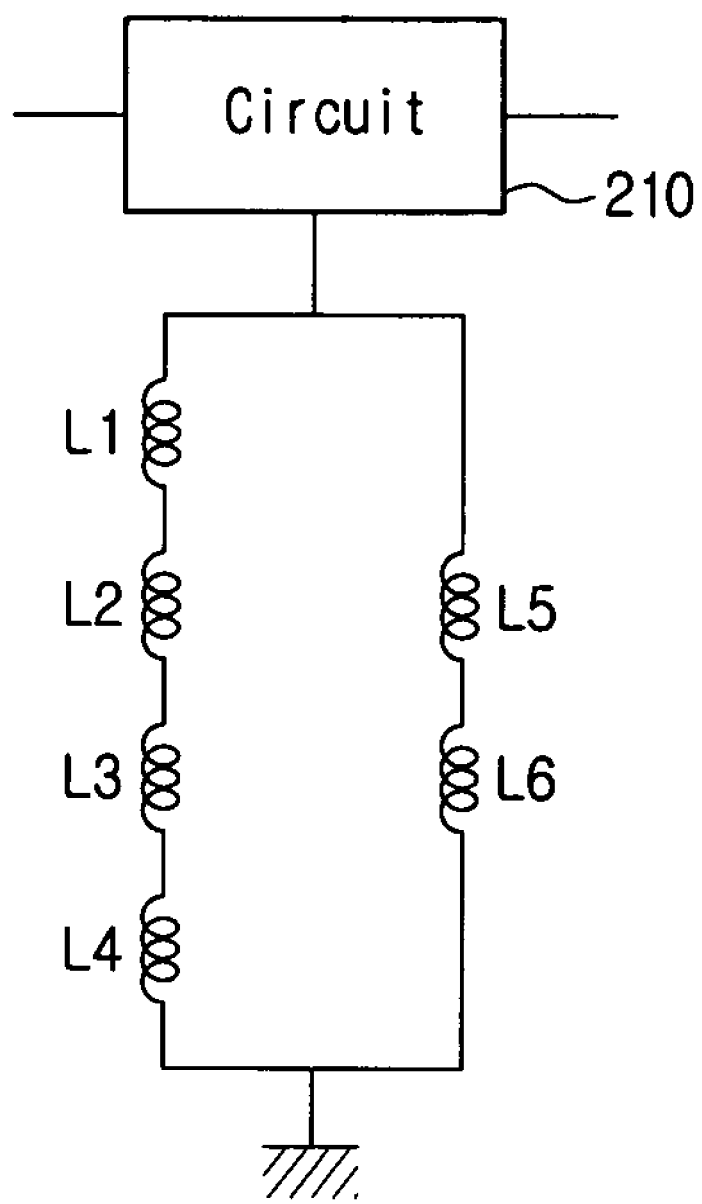
FIG. 4 is a circuit diagram for modeling the packaging chip of FIG. 3.

FIG. 4 is a circuit diagram for modeling the packaging chip of FIG. 3. In FIG. 4, there exist two inductor lines between the circuit element 210 and the ground. Inductors L1, L2, L3, and L4 are connected in series in the left line, and inductors L5 and L6 are connected in series in the right line. The left and right lines are connected in parallel. Accordingly, if the inductance of each line is adjusted, the total inductance magnitude is changed.

As aforementioned, the present invention can implement an inductor in the form of a sealing material needed in a packaging process. Accordingly, the present invention can reduce the size of an entire packaging chip since there is no need to form an inductor as a separate member, and can enhance the Q value since the inductor can be wider in width compared with when the inductor is separately formed.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A packaging chip, comprising:
    a substrate for mounting a circuit element therein;
    at least one signal port formed on a surface of the substrate and formed at one side of the circuit element;
    a sealing portion electrically connected on the substrate to the circuit element and the at least one signal port, respectively; and
    a packaging substrate bonded to the substrate through the sealing portion and packaging the circuit element,
    wherein the sealing portion is made of a conductive material, and provides the circuit element with inductance, and
    wherein a portion at which the sealing portion is electrically connected to the circuit element and a portion at which the sealing portion is electrically connected to the at least one signal port are formed separately.

2. The packaging chip of claim 1, further comprising at least one ground port.

3. The packaging chip of claim 2, wherein the sealing portion includes:
    a sealing line stacked on an edge of the substrate;
    a first connection line for electrically connecting at least one of the signal port and the ground port to the sealing line; and
    a second connection line for electrically connecting the circuit element to the sealing line.

* * * * *